United States Patent
Zettler

(10) Patent No.: US 7,233,161 B2
(45) Date of Patent: Jun. 19, 2007

(54) INTEGRATED CIRCUIT AND ASSOCIATED PACKAGED INTEGRATED CIRCUIT HAVING AN INTEGRATED MARKING APPARATUS

(75) Inventor: Thomas Zettler, Höhenkirchen-Siegertsbrunn (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 11/150,625

(22) Filed: Jun. 10, 2005

(65) Prior Publication Data

US 2005/0225348 A1 Oct. 13, 2005

Related U.S. Application Data

(63) Continuation of application No. PCT/DE03/04224, filed on Dec. 13, 2003.

(30) Foreign Application Priority Data

Dec. 14, 2002 (DE) ............... 102 58 511

(51) Int. Cl.
 *G01R 31/26* (2006.01)
(52) U.S. Cl. .................... 324/763; 324/765
(58) Field of Classification Search ........ 324/760–766, 324/158.1; 714/731–733, 42; 365/200–201
See application file for complete search history.

(56) References Cited

U.S. PATENT DOCUMENTS

| 3,623,603 A | * | 11/1971 | Casner et al. ............. 209/3.3 |
| 4,961,053 A | | 10/1990 | Krug |
| 4,992,729 A | * | 2/1991 | Nadeau ..................... 324/765 |
| 5,570,035 A | * | 10/1996 | Dukes et al. ............... 324/763 |
| 5,673,028 A | * | 9/1997 | Levy .......................... 340/635 |
| 5,768,290 A | | 6/1998 | Akamatsu |
| 5,789,932 A | | 8/1998 | Michael |
| 6,040,773 A | * | 3/2000 | Vega et al. .............. 340/572.1 |
| 6,091,079 A | | 7/2000 | Green et al. |
| 6,211,689 B1 | | 4/2001 | Oki |
| 6,378,774 B1 | * | 4/2002 | Emori et al. ............... 235/492 |

(Continued)

FOREIGN PATENT DOCUMENTS

DE 197 23 262 A1 4/1998

(Continued)

OTHER PUBLICATIONS

International Search Report from corresponding International patent application No. PCT/DE2003/04224.

(Continued)

*Primary Examiner*—Vinh P. Nguyen
(74) *Attorney, Agent, or Firm*—Brinks Hofer Gilson & Lione

(57) ABSTRACT

An integrated circuit and an associated packaged integrated circuit are provided which improve testability and reduce the test costs. The integrated circuit contains an integrated functional circuit to be tested, a test interface that connects the functional circuit to a test apparatus which performs a function test on the functional circuit to ascertain a test result, and an integrated self-marking apparatus that produces a marking on the basis of the test result. The marking can be magnetic or optical or electrical, volatile or nonvolatile, and thermally or electrically activated. The test apparatus includes an external test unit or an integrated self-test unit. Nonvolatile memory elements store the test results in a buffer.

19 Claims, 5 Drawing Sheets

U.S. PATENT DOCUMENTS

| | | | |
|---|---|---|---|
| 6,421,794 B1 * | 7/2002 | Chen et al. ................... 714/42 |
| 6,466,007 B1 * | 10/2002 | Prazeres da Costa et al. ...................... 324/158.1 |
| 6,540,617 B2 | 4/2003 | Lindenthal et al. |
| 6,788,091 B1 * | 9/2004 | Weber ........................ 324/765 |
| 6,969,006 B1 * | 11/2005 | Smith, Sr. ................... 235/487 |
| 2001/0020935 A1 | 9/2001 | Gelbman |
| 2002/0019964 A1 | 2/2002 | Zettler |

FOREIGN PATENT DOCUMENTS

| | | |
|---|---|---|
| DE | 100 37 794 A1 | 2/2002 |
| DE | 101 08 924 A1 | 9/2002 |
| EP | 1 178 323 A2 | 2/2002 |
| JP | 61064137 A | 4/1988 |
| JP | 63102332 A | 5/1988 |
| JP | 05326653 A | 12/1993 |
| JP | 06053292 A | 2/1994 |
| JP | 11026650 A | 1/1999 |
| JP | 2001127236 A | 5/2001 |
| JP | 2002329731 A | 11/2002 |

OTHER PUBLICATIONS

International Examination Report from corresponding International patent application No. PCT/DE2003/04224.

* cited by examiner

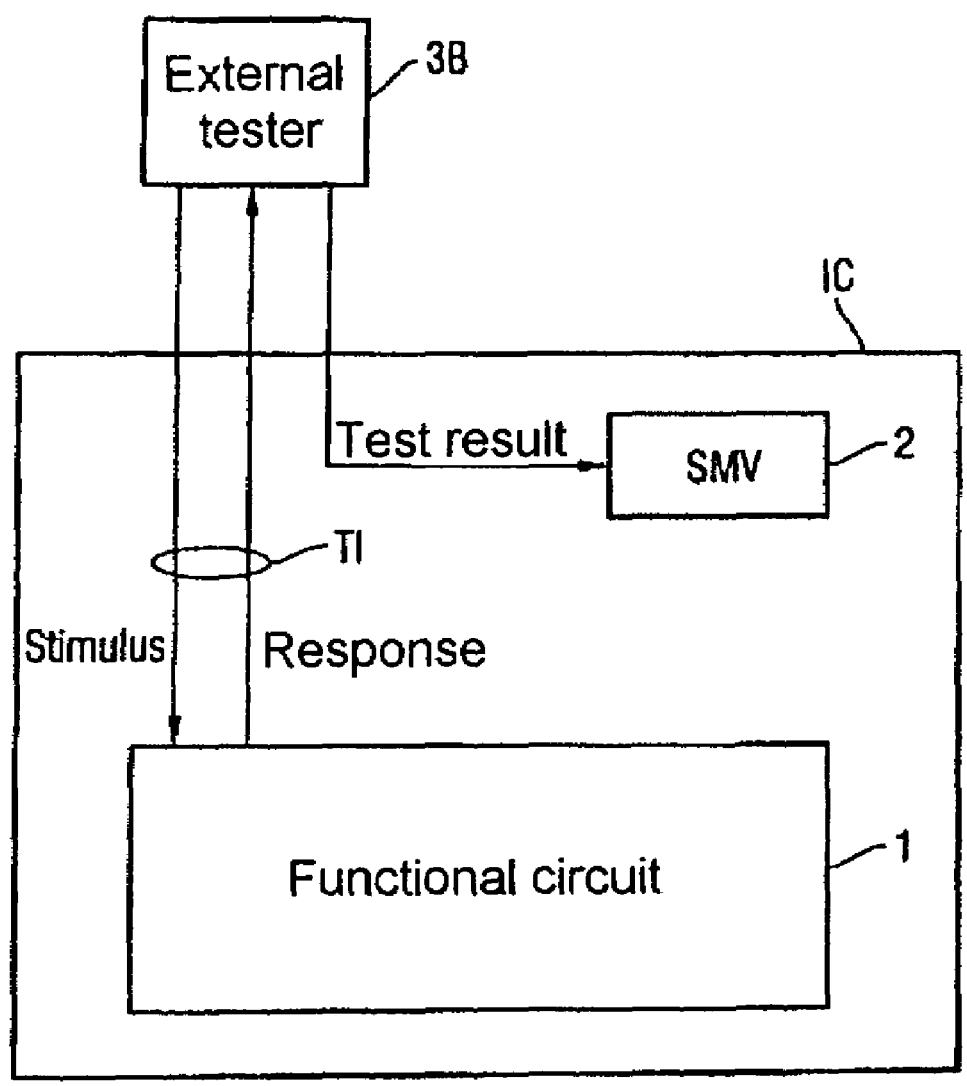

Section along A-B

Section along A-B with passivation opening

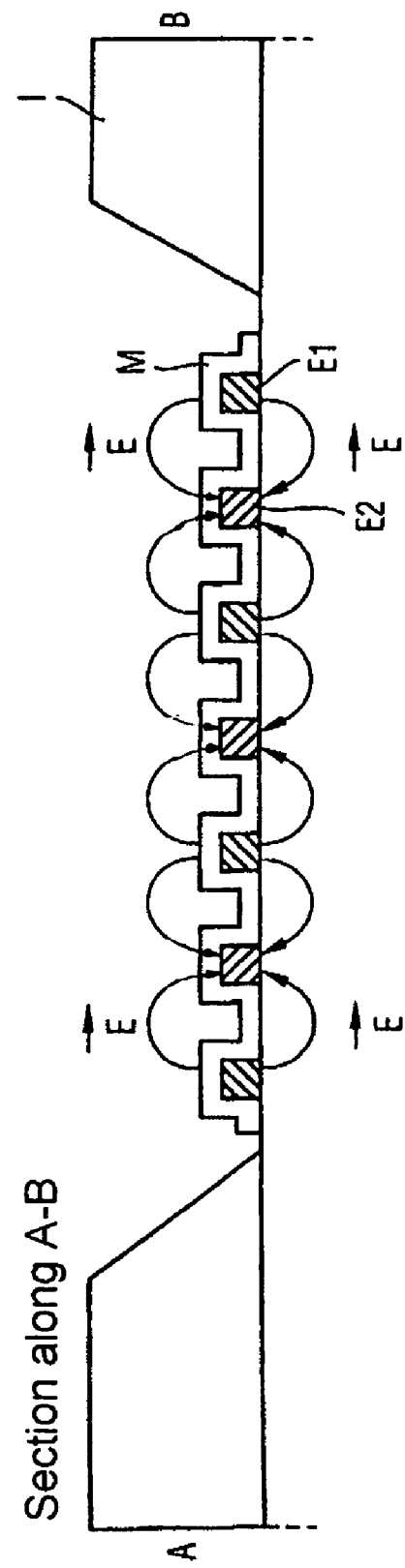
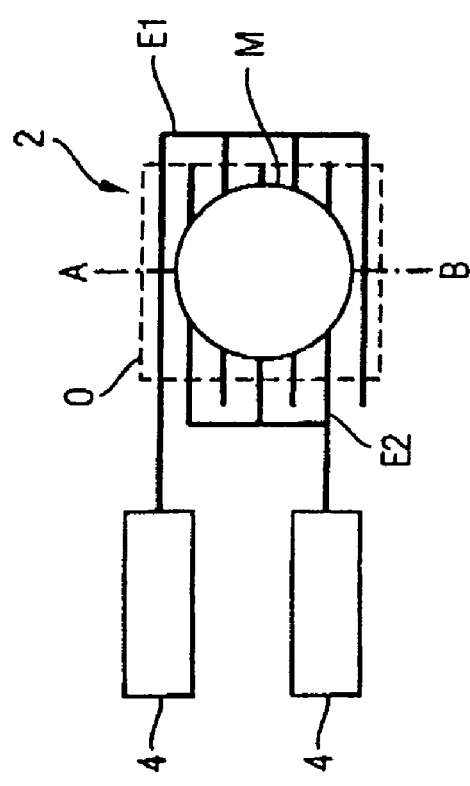
FIG 5A
FIG 5B
Section along A-B

INTEGRATED CIRCUIT AND ASSOCIATED PACKAGED INTEGRATED CIRCUIT HAVING AN INTEGRATED MARKING APPARATUS

PRIORITY

This application is a continuation of International Application PCT/DE03/04224, filed Dec. 13, 2003, which claims the benefit of priority to German Patent Application DE 102 58 511.3, filed on Dec. 14, 2002, both of which are incorporated herein by reference.

TECHNICAL FIELD

The present invention relates to an integrated circuit. More specifically, the invention relates to an associated packaged integrated circuit having improved testability.

BACKGROUND

For quality assurance when fabricating integrated semiconductor circuits and also packaged or mounted integrated circuits, one test step is the determination of working, as yet unseparated, chips on a semiconductor wafer. Another test is performed on the semiconductor chips packaged in a package as a finished item. The test costs for the integrated semiconductor circuits or chips and also for the finally mounted packaged integrated circuits make up a significant proportion of the total costs in semiconductor fabrication.

In this context, the continually rising integration density of integrated semiconductor circuits causes a series of problems in the implementation of an inexpensive, fast and reliable production test. A problem with observability exists as the number of internal components of an integrated semiconductor circuit rises much more quickly than the number of connection pins which are present on a package. In addition, the typical system frequencies are on the rise, which means that a test under operating conditions requires ever more expensive high performance testers. Additionally, the clock frequency often does not increase to the same degree as, by way of example, a number of memory cells in a memory integrated in the system. This lead, for the same test algorithms, to an increasing test time and hence rising test costs per product. Likewise, the consistent transmission of the test results in currently different standards presents a logistical challenge, particularly when using different subcontractors for separate wafer production and mounting, for example.

A reduction in test time and in test and also logistical costs can thus be achieved most effectively by virtue of a combined approach covering circuit design, test concept, tester and mounting design and logistics. Such an improved test method is known, by way of example, from EP 1 178 323, in which integrated circuits to be tested each have integrated self-test units (built-in self-test units or ""BISTs"") and a self-test is performed at an earlier time than the reading of the test results for the self-test.

FIG. 1 shows a simplified plan view of a semiconductor wafer W having a multiplicity of integrated semiconductor circuits IC formed thereon, in line with these conventional methods. In this case, all the integrated circuits IC on a semiconductor wafer W are actually supplied with a voltage supply at wafer level, which means that the self-test units produced in the multiplicity of integrated circuits IC can actually perform a contemporaneous self-test. Thus, only the test information obtained or the test result needs to be read by making individual contact, for example, and faulty integrated circuits IC are subsequently marked in the usual manner using these test results in the event of an operating fault.

A normal marking method in this context is ""inking"", where functionally impaired integrated circuits are provided with an ink dot which subsequently, as a selection criterion for downstream mounting units, results in accordingly marked chips being rejected.

A drawback in this context, however, is that particularly when BISTs are used, the test results need to be stored in a memory. On the one hand, this can be done in volatile electrically readable memories or in nonvolatile electrically readable memories, with the volatile memories requiring a constant power supply. On the other hand, nonvolatile memories result in increased production costs and require additional voltages which are increased as compared with a standard supply voltage.

For this reason, the exclusive use of BIST methods or self-test methods particularly for the wafer test has still not been implemented at a broad level, despite the potentially high cost advantage, since after the self-test every integrated semiconductor circuit or every chip IC needs to be brought into contact with a tester again and the result subsequently needs to be evaluated. Since these handling and contact times take up a large portion of the test time and hence of the test costs, however, the advantages of these self-test methods (BIST methods) are significantly reduced.

BRIEF SUMMARY

By way of introduction only, in an embodiment, an integrated circuit and associated packaged integrated circuit are provided that contain an integrated functional circuit to be tested, a test interface that connects the functional circuit to a test apparatus which performs a function test on the functional circuit to ascertain a test result, and an integrated self-marking apparatus that produces a magnetically readable marking on the basis of the test result.

The integrated self-marking apparatus has a marking element for producing the marking and a marking element activation unit for activating the marking element. This permits simple implementation of the marking and allows already existing systems to continue to be used for identifying the markings.

The marking is nonvolatile and the marking element is an optical marking element for producing an optically readable marking, a magnetic marking element for producing a magnetically readable marking and/or an electrical marking element for producing an electrically readable marking. In some embodiments, the markings can be detected contactlessly, which results in a significant time advantage.

The test apparatus may be an integrated self-test unit, which allows the test time to be significantly reduced. It is also possible to use an external test unit as test apparatus, which allows more complex test results to be evaluated. In addition, the integrated self-marking apparatus can have a multiplicity of self-marking apparatus components for producing marking components on the basis of test result components from the integrated functional circuit, which means that the tested integrated circuits can be classified more thoroughly. These components can be of the same or different types (i.e. electrical, optical, or magnetic).

In addition, the integrated circuit can have nonvolatile memory elements for buffer-storing the test results. This permits ""multistage tests"", such as a wafer test and a subsequent product test, to be configured differently.

In the packaged integrated circuit, the integrated circuit is packaged in a package which includes, at least in the region of the self-marking apparatus, a material which allows the marking on the integrated circuit to be read. This means that markings for a mounted integrated circuit can be produced automatically and using the same self-marking apparatus, not just at wafer level but also at product level.

The package is optically transparent, for example, or has an inspection window in the region of the self-marking apparatus. Alternatively or additionally, the packaged integrated circuit can also have a package self-marking apparatus, formed in the package, for producing a separate package marking on the basis of a test result, however, with the package self-marking apparatus again being of identical design to the integrated self-marking apparatus in the integrated circuit. This allows package tests to be improved further.

The foregoing summary has been provided only by way of introduction. Nothing in this section should be taken as a limitation on the following claims, which define the scope of the invention.

BRIEF DESCRIPTION OF THE DRAWINGS

The following text explains in more detail a number of embodiments of the invention, using schematic drawings, in which:

FIG. 3 shows a simplified block diagram of an integrated circuit with a self-marking apparatus in a second exemplary embodiment;

FIGS. 5A and 5B show a simplified plan view and a simplified sectional view of a field sensitive self-marking apparatus;

Identical or functionally identical elements are provided with the same reference symbols in the figures.

DETAILED DESCRIPTION OF THE PREFERRED EMBODIMENTS

An integrated circuit and an associated packaged integrated circuit are provided which improve testability further and, in particular, reduce the test costs. As a result of the use of an integrated self-marking apparatus for producing a marking on the basis of a test result obtained by a test apparatus, a marking which is normally applied by an external marking apparatus can be produced automatically by the integrated circuit.

Figure 1:
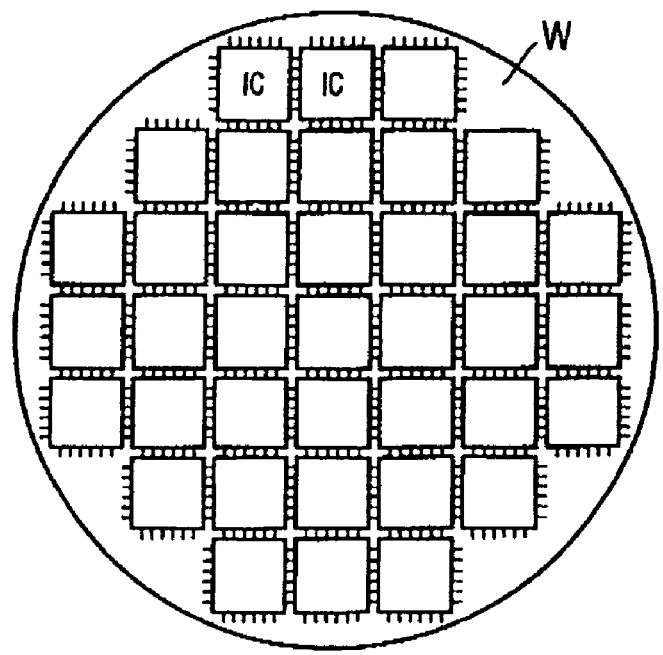
FIG. 1 shows a simplified plan view of a semiconductor wafer with integrated circuits illustrating a conventional test method.
Figure 2:
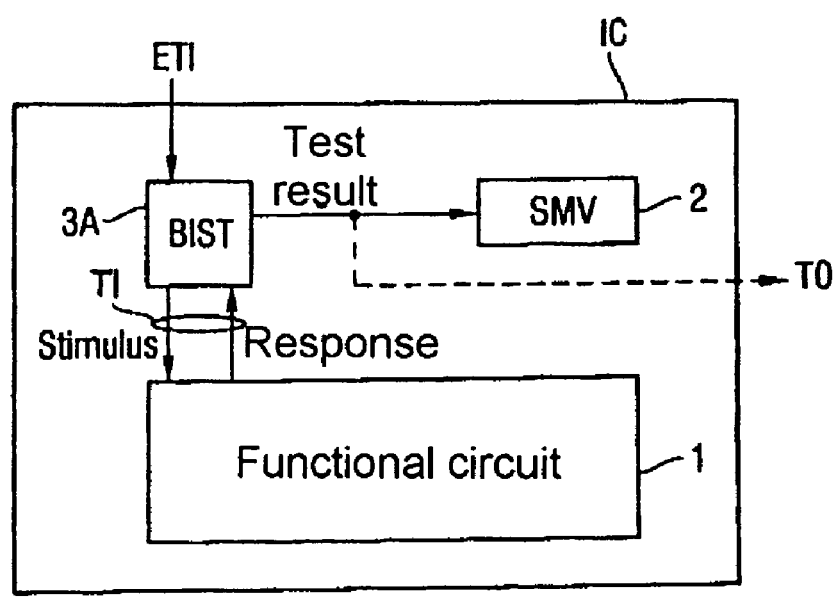
FIG. 2 shows a simplified block diagram of an integrated circuit with a self-marking apparatus in a first exemplary embodiment.

FIG. 2 shows a simplified block diagram of an integrated circuit in a first exemplary embodiment, as may be found, by way of example, on a semiconductor wafer W in FIG. 1 together with further integrated circuits IC. In the same way, however, it may also already be in the form of a separate semiconductor chip or integrated circuit IC, as is the case after sawing, for example.

In FIG. 2, the integrated circuit IC has an integrated functional circuit 1 to be tested and also a test interface TI for connecting the functional circuit 1 to a test apparatus which comprises at least an integrated self-test unit 3A (BIST, Built In Self Test), as is usually produced in integrated circuits for performing a self-test. An external test interface ETI can be used, by way of example, to actuate this self-test unit 3A or to supply it with additional data during a self-test operation. In this context, the test interface TI transmits stimulus data which are to be transmitted by the test apparatus and also response data transmitted by the functional circuit. The test apparatus in the form of the self-test unit 3A accordingly performs a function test on the integrated functional circuit 1 in order to ascertain a test result, the functional circuit 1 being, by way of example, a primary logic circuit and the test result being a simple "pass/fail" result.

In addition, the integrated circuit IC shown in FIG. 2 has an "integrated" self-marking apparatus 2 (SMV) which produces a marking on the basis of the ascertained test result from the test apparatus or from the self-test unit 3A. Optionally, the ascertained test result can also be passed to the outside via an additional interface TO (Test Output), shown in dashes, which makes additional electrical evaluation of the test result possible.

On account of the integrated self-marking apparatus 2, which takes the test result as a basis for producing a marking, on the surface of the integrated semiconductor circuit, further contact may be avoided following performance of the self-test in order to read and evaluate the test results and to make a marking on the basis of the ascertained test results and the semiconductor circuit with which there is currently contact.

Particularly in the case of the test method mentioned at the outset, where a multiplicity of integrated circuits IC actually perform a simultaneous self-test at wafer level, further parallelization is obtained through the contemporaneous production of markings for the individual integrated circuits IC. Both the test time and the test costs can be significantly reduced as a result.

FIG. 3 shows a simplified block diagram of an integrated circuit in a second exemplary embodiment, where the same reference symbols denote the same or corresponding elements and a repeat description is dispensed with below.

In FIG. 3, the test apparatus no longer has an integrated self-test unit 3A, but rather has just an external tester 3B which is again connected via the test interface TI to the functional circuit 1 which is to be tested. In this context, the test interface TI again transmits stimulus data which are to be transmitted by the test apparatus and response data transmitted by the functional circuit.

The external test unit 3B takes the stimulus and response data as a basis for ascertaining a test result and supplies it via a test result interface to the integrated circuit and particularly to the self-marking apparatus 2 integrated therein. The integrated self-marking apparatus 2 takes this test result as a basis for producing a marking on the integrated circuit IC.

In the second exemplary embodiment, allowance is made for the actual development where, despite an increase in the BIST or self-test proportion in test methods used, integrated semiconductor circuits IC are still usefully checked using external test units 3B and associated external test methods.

In a third exemplary embodiment (not shown), a combination of the internal self-test unit 3A shown in FIG. 2 with the external test unit 3B shown in FIG. 3 is also possible, with parts of the functional circuit 1 or of the integrated circuit IC being checked by an external test unit 3B and other parts of the integrated circuit IC being checked by an integrated self-test unit 3A. When self-test units 3A are used, the application of the parallel test concept as shown in FIG. 1 is appropriate.

Figure 4A:
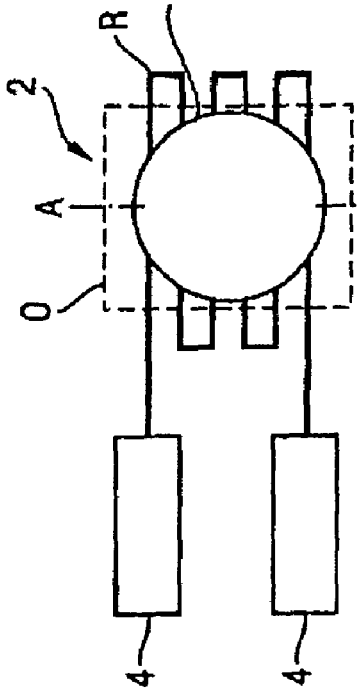
FIGS. 4A to 4C show a simplified plan view and simplified sectional views of a temperature sensitive self-marking apparatus.
Figure 4B:
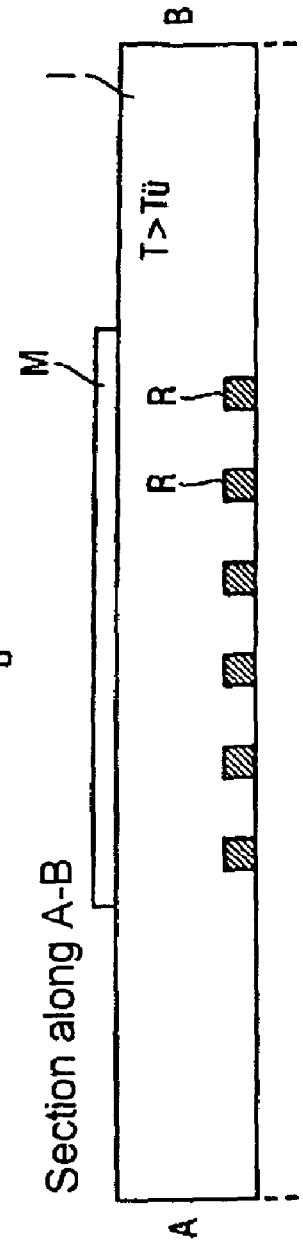
Figure 4C:
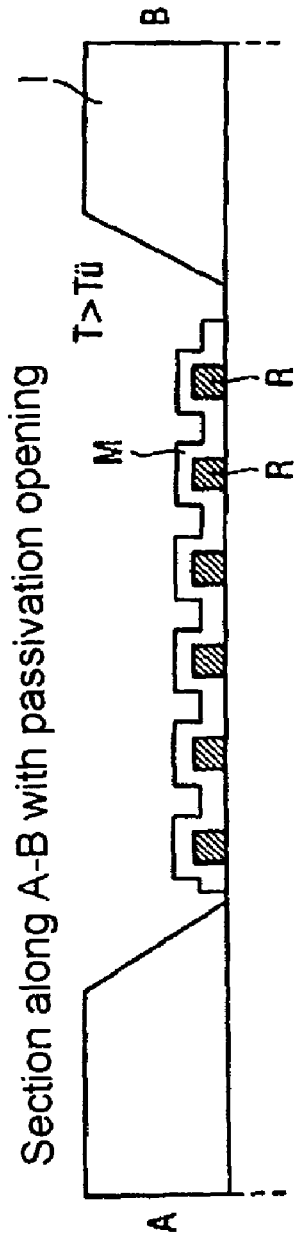

FIGS. 4A to 4C show a simplified plan view and also simplified sectional views of a temperature sensitive integrated self-marking apparatus, as can be produced, by way of example, in an integrated circuit IC as shown in FIG. 2 or 3.

FIG. 4A shows a simplified plan view of an integrated self-marking apparatus 2 in line with a first embodiment, as can be produced, by way of example, on the surface of an integrated circuit IC in the topmost layers of an integrated circuit IC.

In FIG. 4A, the integrated self-marking apparatus 2 comprises a thermosensitive marking element M for producing the actual marking and a marking element activation unit for activating the marking element M. In FIG. 4A, the marking element activation unit is a thermal marking element activation unit, since the temperature sensitive marking element M is activated by means of thermal energy or on the basis of a temperature change. By way of example, such a thermal marking element activation unit has connection electrodes 4 which are connected to one another by means of an electrically conductive interconnect or a resistive structure R.

FIG. 4B shows a simplified sectional view along a section A-B from FIG. 4A, with the same reference symbols denoting the same or corresponding elements and a repeat description being dispensed with below. In FIG. 4B, the thermal marking element activation unit is essentially in the form of a meandrous interconnect region in a topmost interconnect or metallization plane in an integrated semiconductor circuit IC and is separated or spaced apart from the marking element M by means of a final insulating or passivation layer I.

In the simplest case, the thermal marking element activation unit therefore comprises an electrically conductive interconnect R which is in direct proximity to the marking element M and is heated by the supply of current. To apply the test result to the connection electrodes 4, a large current is impressed into the interconnect R, for example for a faulty integrated semiconductor circuit IC, which results in thermal heating on the basis of the resistance of the interconnect or resistive element R. If this heating causes the temperature T in the region of the marking element M to exceed a critical temperature $T_Ü$ for the marking element, at which the marking element M changes from a first state to a second state, then this state change in the marking element M produces the desired marking for the integrated semiconductor circuit IC.

FIG. 4C shows a simplified sectional view along a section A-B in a second embodiment of the thermosensitive self-marking apparatus 2, where the same reference symbols denote the same or corresponding elements and a repeat description is dispensed with below.

In FIG. 4C, a passivation opening O (shown in dashes in FIG. 4A) can therefore be produced in the region of the marking element activation unit or the resistive element R, with the marking element M being produced directly or with a very thin insulating layer on the interconnect or the resistive element R. This gives increased thermal coupling between the resistive element R, which causes the temperature increase, and the marking element M. To produce such an opening, it is possible to use conventional etching methods depending on a respectively used insulating or passivation layer I.

To provide such a thermal integrated self-marking apparatus, by way of example an ordinary production process, for example to provide a CMOS circuit, is followed by photolithographical (for example) patterning of the resistive elements R in the topmost metallization plane using conventional methods, and finally application of a drop of a substance which is suitable as a marking element M. The marking element M can be applied, by way of example, by carrying out inkjet printing methods, chemical deposition methods (CVD, Chemical Vapor Deposition), sputtering (PVD, Physical Vapor Deposition) etc., to ensure sufficient thermal coupling to the resistive structure R.

Examples of suitable substances or materials for the marking element M are all thermosensitive dyestuffs which undergo a change of color at a critical temperature $T_Ü$. By way of example, the marking element M used may be a chalcogenide film, as described by Giacomel in "Eraseable optical memory employing a marman effect phase-change erasing in a chalcogenide film" 1988. Such a layer or such a material has a phase change from a weakly reflective phase to a highly reflective crystalline phase at a critical temperature $T_Ü=200°$ C. This change can be evaluated optically, for example using laser detectors or CCD cameras. In the same way, liquid crystals (LC) and also other substances are also suitable as optical marking elements for providing an optically readable marking.

These optical marking elements therefore allow simple "pass/fail" information to be indicated directly, which is why the self-marking apparatus 2 replaces the normally used "ink process" work steps and installations. The marking produced by the marking element M can in this case be evaluated by already existing evaluation systems and can thus be integrated into already existing production processes without additional costs.

As an alternative to the optical marking element described above for providing an optically readable marking, however, it is also possible to use magnetic marking elements in the same way to provide a magnetically readable marking in conjunction with the thermal marking element activation unit in line with FIGS. 4A to 4C. Consequently, instead of an optical marking element, a magnetic marking element M is either spaced apart by a passivation layer I, in FIG. 4B, close to the resistive structure R, or, in FIG. 4C, is produced on the resistive structure R directly or via a very thin insulating layer (not shown).

Such magnetic marking elements are, by way of example, ferromagnetic substances or materials which are applied in premagnetized form onto the insulating layer I or directly onto the resistive structure R. In this context, the magnetic marking elements M make use of the properties of premagnetized ferromagnetic substances, with heating above a critical temperature $T_Ü$ lifting their static magnetization and making them paramagnetic. Suitable materials for such magnetic marking elements M are, by way of example, nickel ($T_Ü(Ni)=649$ K), gadolinium ($T_Ü(Gd)=302$ K) and various alloys.

To read the magnetic marking, in contrast to optical reading, for example using a laser or using a CCD camera with subsequent image processing and pattern recognition, a coil or field sensor sweeping over the marking element M is used, for example, as is known from hard disk drives. An advantage in this context is again the contactless reading method, which is fast and protects the material, and also the invisibility of the marking.

The magnetic material chosen for the marking element M may also be the "giant magnetoresistance" material known from MRAM memories, with the material being actuated in the same way as in MRAM memories. In addition, the electrical marking elements M used may be, by way of example, interconnect fuses, dielectric antifuses etc., with such electrically readable marking elements having the drawback of contact being made.

FIGS. 5A and 5B show a simplified plan view and a simplified sectional view of a field sensitive integrated self-marking apparatus, with the same reference symbols again denoting the same or corresponding elements as in FIGS. 4A to 4C and a repeat description being dispensed with below.

In FIGS. 5A and 5B, an E-field activated integrated self-marking apparatus 2 is shown, with activation of the field sensitive marking element M now being brought about not by means of a temperature change but rather by means of a change in an electrical field.

In FIG. 5A, the marking element activation unit accordingly comprises a first electrode E1 and a second electrode E2, spaced apart from the latter, which are in turn respectively connected to the connection electrodes 4. When a voltage or a positive test result is applied, an electrical field E is therefore produced in the electrodes E1 and E2, which are interleaved in the manner of a comb, for example. The electrical field E brings about a change in the E-field activatable marking element M.

In FIG. 5B, the electrodes E1 and E2 are again formed in a topmost interconnect plane or metallization plane, and they have the comb structure shown in FIG. 5A, for example. Again, the marking element M can be separated or spaced apart from the marking element activation unit or the electrodes E1 and E2 by means of an insulating layer or passivation layer I, but it has preferably been applied directly onto the electrodes E1 and E2 or is separated only by a very thin insulating layer (not shown).

The materials used for such E-field activatable or field sensitive marking elements M can be, by way of example, the liquid crystals (LC) known from liquid crystal displays, and the like.

Further E-field sensitive materials which can be used are, by way of example, electrophoretic substances (electronic ink), as described, by way of example, by Smith in "Electrostatic discharge indicator" 1999 and Comiskey in "Method of manufacturing of a discrete electronic device" 1999.

Although a power supply is available, particularly during a conventional self-test operation, in the case of the test method, the materials used for the marking elements M are preferably materials which leave behind a nonvolatile marking, i.e. there is no return to the original state after the optical or magnetic or electrical properties have been changed, even if there is no power supply. This means that integrated circuits which have been disconnected from a power supply can also retain their markings irreversibly.

Figure 7:
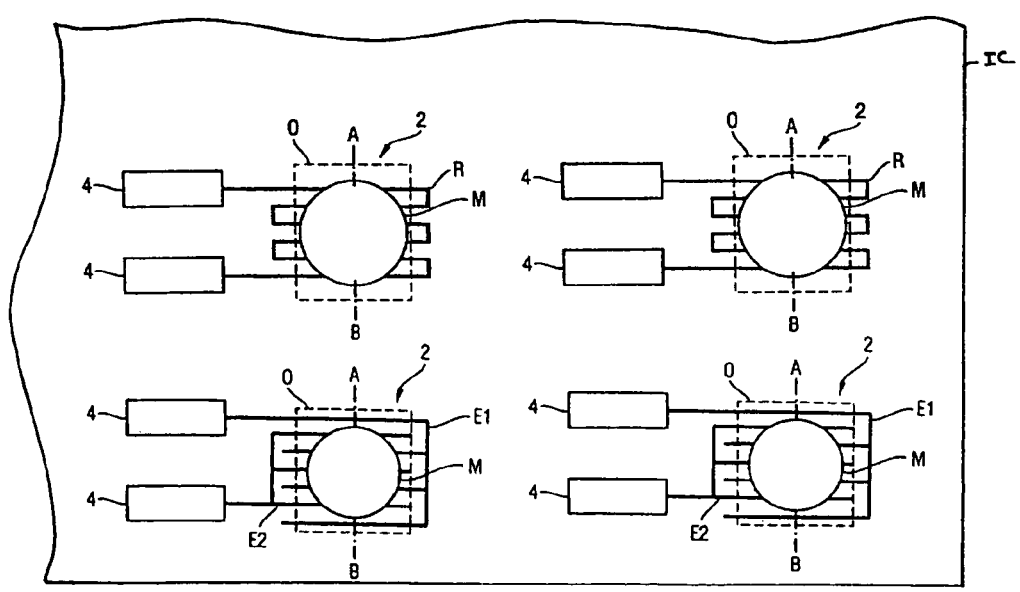
FIG. 7 is a plan view of a multiplicity of self-marking apparatuses on the surface of an integrated circuit.

In addition, it is also possible for a multiplicity of self-marking apparatus components for producing marking components on the basis of test result components from the integrated functional circuit to be produced in the integrated circuit IC. To be more precise, it is possible for a multiplicity of the self-marking apparatuses 2 described above, as shown in FIGS. 4 and 5, to be produced preferably on the surface of the integrated circuit IC, as shown in FIG. 7. which provides the option of classification. This allows, by way of example, optical or magnetic indication of chip speed classes to be implemented automatically. In the same way, however, it is also possible to indicate memory sizes or audio quality classes for an integrated circuit optically or magnetically. integrated circuit IC. To be more precise, it is possible for a multiplicity of the self-marking apparatuses 2 described above, as shown in FIGS. 4 and 5, to be produced preferably on the surface of the integrated circuit IC, which provides the option of classification. This allows, by way of example, optical or magnetic indication of chip speed classes to be implemented automatically. In the same way, however, it is also possible to indicate memory sizes or audio quality classes for an integrated circuit optically or magnetically.

In addition to the (preferably nonvolatile) marking elements M described above, it is also possible to use electrically readable nonvolatile memories in the form of EEPROMs, FlashPROMs, magnetic RAMs (MRAM), ferroelectric RAMs (FRAM), chalcogenide memories (Ovonics) etc., which means that, particularly when self-test units (BIST) are used, the test results obtained from previous test passes can be buffer-stored and hence, by way of example, a multistage test, such as first a wafer test and then a product test, can be configured differently. In this context, each test can in turn be assigned a dedicated marking element (component) M which is not activated until in the "correct" test section.

Figure 6:
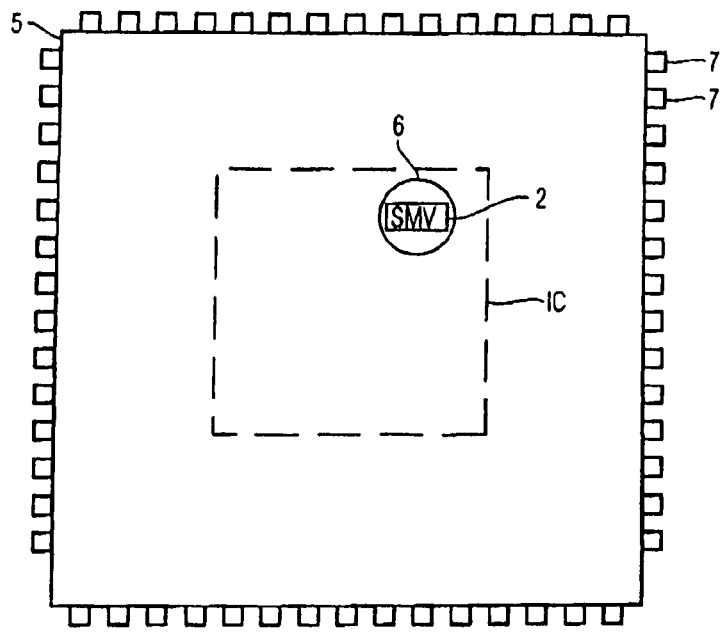
FIG. 6 shows a simplified plan view of a packaged integrated circuit.

FIG. 6 shows a simplified plan view of a packaged integrated circuit, with the same reference symbols denoting the same or corresponding elements as in FIGS. 1 to 5 and a repeat description being dispensed with below.

In FIG. 6, the integrated circuit IC has been packaged, by way of example, in a product package 5 which has a multiplicity of connection pins 7. Accordingly, the integrated self-marking apparatus 2 can also be used for a product test or package test, with final mounting or packaging in the package 5 being followed in turn by the performance of an external and/or self-test.

In this context, the internal test interface TI or external test interface ETI for the integrated circuit IC is connected to connection pins 7 (provided specifically for the purpose) on the product package 5, which means that the finally mounted or packaged integrated circuit IC can also be subjected to a function test.

When using magnetic marking elements or electrical marking elements, it is even possible in this context to use the usual plastic materials to produce the product package 5. However, if optical marking elements are used in the self-marking apparatus 2, then the package 5 may comprise, at least in the region 6 of the self-marking apparatus 2, a material which allows the marking on the integrated circuit IC to be read.

By way of example, optically transparent plastic packages are therefore used or a window 6 made of optically transparent material is produced in the package 5 in the region of the self-marking apparatus 2. In the same way, when magnetic marking elements are used, the package 5 is permeable to such magnetic fields at least in the region 6 of the self-marking apparatus 2.

In another exemplary embodiment (not shown), however, the packaged integrated circuit can also have a package self-marking apparatus (comparable to the self-marking apparatus 2 in the integrated circuit IC) which has been produced on a surface region of the package 5 and is suitable for producing a package marking on the basis of a test result. In this context, the design of this package self-marking apparatus corresponds essentially to the design of the self-marking apparatus 2 described above.

The invention has been described above with reference to specific materials for producing the respective marking elements. It is not limited thereto, however, and in the same way comprises alternative materials which are suitable as marking elements in the same way. In the same way, the invention relates not just to thermal and field sensitive self-marking apparatuses, but also to corresponding alternative self-marking apparatuses. Accordingly, the invention is not limited to the temperature sensitive and field sensitive materials described, but in the same way includes alternative materials which are suitable as marking elements in the same way.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

The invention claimed is:

1. An integrated circuit comprising
an integrated functional circuit to be tested;
a test interface that connects the functional circuit to a test apparatus which performs a function test on the functional circuit to ascertain a test result; and
an integrated self-marking apparatus that produces a magnetically readable marking on the basis of the test result.

2. The integrated circuit as claimed in claim 1, wherein the integrated self-marking apparatus comprises a magnetic marking element that produces the magnetically readable marking and a marking element activation unit that activates the marking element.

3. The integrated circuit as claimed in claim 2, wherein the magnetic marking element comprises a thermosensitive marking element, and the marking element activation unit brings about a change in temperature.

4. The integrated circuit as claimed in claim 2, wherein the magnetic marking element comprises a field sensitive marking element, and the marking element activation unit brings about a change in an electrical field.

5. The integrated circuit as claimed in claim 2, wherein the marking element comprises at least one of an electrical marking element that produces an electrically readable marking or an optical marking element that produces an optically readable marking.

6. The integrated circuit as claimed in claim 1, wherein the magnetically readable marking comprises a nonvolatile marking.

7. The integrated circuit as claimed in claim 1, wherein the test apparatus comprises at least one of an external test unit or an integrated self-test unit.

8. The integrated circuit as claimed in claim 1, wherein the integrated self-marking apparatus has a multiplicity of self-marking apparatus components that produce marking components on the basis of test result components from the integrated functional circuit.

9. A packaged integrated circuit comprising an integrated circuit as claimed in claim 1 which is packaged in a package, wherein the package comprises, in a region of the self-marking apparatus, a material which permits the marking on the integrated circuit to be read.

10. The packaged integrated circuit as claimed in claim 9, wherein the package is permeable to magnetic fields in the region of the self-marking apparatus.

11. The packaged integrated circuit as claimed in claim 9, wherein the test interface in the integrated circuit can be actuated by means of connection pins on the package.

12. A packaged integrated circuit comprising:
an integrated circuit to be tested;
a test interface that connects the integrated circuit to a test apparatus which performs a function test for the integrated circuit to ascertain a test result; and
a package self-marking apparatus, formed in a package, that produces a magnetically readable package marking on the basis of the test result.

13. The packaged integrated circuit as claimed in claim 12, wherein the package self-marking apparatus comprises a magnetic marking element that produces the magnetically readable marking and a marking element activation unit that activates the marking element.

14. An integrated circuit comprising
an integrated functional circuit to be tested:
a test interface that connects the functional circuit to a test apparatus which performs a function test on the functional circuit to ascertain a test result
an integrated self-marking apparatus that contains a multiplicity of self-marking apparatus components that produce marking components of different types on the basis of test result components from the integrated functional circuit wherein the self-marking apparatus comprises marking elements that produce the marking components and at least one marking element activation unit that activates the marking components: and
wherein at least one of the marking elements comprises a magnetic marking element that produces a magnetically readable marking component and a marking element activation unit that activates the marking component.

15. The integrated circuit as claimed in claim 14, wherein at least one of the marking elements comprises a thermosensitive marking element, and the at least one marking element activation unit comprises a thermosensitive marking element activation unit that brings about a change in temperature.

16. The integrated circuit as claimed in claim 14, wherein the marking components comprise a nonvolatile marking component.

17. The integrated circuit as claimed in claim 14, wherein the test apparatus comprises at least one of an external test unit or an integrated self-test unit.

18. The integrated circuit as claimed in 14, wherein at one of the marking components can be detected contactlessly.

19. An integrated circuit comprising
an integrated functional circuit to be tested:
a test interface that connects the functional circuit to a test apparatus which performs a function test on the functional circuit to ascertain a test result
an integrated self-marking apparatus that contains a multiplicity of self-marking apparatus components that produce marking components of different types on the basis of test result components from the integrated functional circuit:
wherein the self-marking apparatus comprises marking elements that produce the marking components and at least one marking element activation unit that activates the marking components: and
wherein at least one of the marking elements comprises a field sensitive marking element, and the at least one marking element activation unit comprises a field sensitive marking element activation unit that brings about a change in an electrical field.

* * * * *

UNITED STATES PATENT AND TRADEMARK OFFICE
CERTIFICATE OF CORRECTION

PATENT NO. : 7,233,161 B2
APPLICATION NO. : 11/150625
DATED : June 19, 2007
INVENTOR(S) : Thomas Zettler It is certified that error appears in the above-identified patent and that said Letters Patent is hereby corrected as shown below:

On the Title Page

Item (30), under Foreign Application Priority Data after "102 58" delete "511" and substitute --511.3-- in its place.

Column 10, in claim 14, line 15, immediately after "circuit to be tested" delete ":" (colon) and substitute --;-- (semicolon) in its place.

Column 10, in claim 14, line 18, immediately after "ascertain a test result" delete ":" (colon) and substitute --;-- (semicolon) in its place.

Column 10, in claim 14, line 26, immediately after "the marking components" delete ":" (colon) and substitute --;-- (semicolon) in its place.

Column 10, in claim 18, line 45, after "as claimed" delete "in 14, wherein at one" and substitute --in claim 14, wherein at least one-- in its place.

Column 10, in claim 19, line 48, immediately after "circuit to be tested" delete ":" (colon) and substitute --;-- (semicolon) in its place.

Column 10, in claim 19, line 51, immediately after "ascertain a test result" delete ":" (colon) and substitute --;-- (semicolon) in its place.

Column 10, in claim 19, line 56, immediately after "functional circuit" delete ":" (colon) and substitute --;-- (semicolon) in its place.

UNITED STATES PATENT AND TRADEMARK OFFICE
CERTIFICATE OF CORRECTION

PATENT NO. : 7,233,161 B2
APPLICATION NO. : 11/150625
DATED : June 19, 2007
INVENTOR(S) : Thomas Zettler It is certified that error appears in the above-identified patent and that said Letters Patent is hereby corrected as shown below:

Column 10, in claim 19, line 60, immediately after "the marking components" delete ":" (colon) and substitute --;-- (semicolon) in its place.

Signed and Sealed this

Twenty-first Day of August, 2007

JON W. DUDAS
*Director of the United States Patent and Trademark Office*